(12) United States Patent
Arai et al.

(10) Patent No.: US 6,319,621 B1
(45) Date of Patent: Nov. 20, 2001

(54) COPPER FOIL HAVING GLOSSY SURFACE WITH EXCELLENT OXIDATION RESISTANCE AND METHOD OF MANUFACTURING THE SAME

(75) Inventors: Hideta Arai; Kazuhiko Sakaguchi, both of Hitachi (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/451,317

(22) Filed: Nov. 30, 1999

(30) Foreign Application Priority Data

Dec. 14, 1998 (JP) .................................................. 10-354308

(51) Int. Cl.$^7$ ............................... B32B 15/01; C25D 7/06
(52) U.S. Cl. ......................... 428/658; 205/152; 205/154; 205/155; 205/156; 205/243; 205/244; 205/246; 205/255; 205/258; 428/607; 428/647; 428/648; 428/656; 428/666; 428/667; 428/674; 428/675; 428/680; 428/687
(58) Field of Search ..................................... 428/658, 656, 428/666, 667, 675, 680, 687, 674, 647, 648, 607; 205/152, 154, 155, 156, 243, 244, 246, 255, 258

(56) References Cited

U.S. PATENT DOCUMENTS 4,935,310 * 6/1990 Nakatsugawa ........................ 428/607
5,389,446 * 2/1995 Yamanishi et al. ................... 428/658

FOREIGN PATENT DOCUMENTS 5-299834  11/1993  (JP) .

* cited by examiner

*Primary Examiner*—Robert R. Koehler
(74) *Attorney, Agent, or Firm*—Akin, Gump, Strauss, Hauer & Feld, L.L.P.

(57) ABSTRACT

To establish a technique of further improving the oxidation resistance of the glossy surface of a copper foil that has a composite layer containing chromium, zinc, and phosphorus on its glossy surface is achieved by a copper foil having excellent oxidation resistance characterized by a composite layer containing chromium, zinc, phosphorus, and nickel formed on the glossy surface of the foil and also to a method of manufacturing the same by electrolysis.

5 Claims, No Drawings

COPPER FOIL HAVING GLOSSY SURFACE WITH EXCELLENT OXIDATION RESISTANCE AND METHOD OF MANUFACTURING THE SAME

BACKGROUND OF THE INVENTION

1. Field of the Invention

This invention relates to a copper foil having a glossy surface with excellent oxidation resistance and also to a method of manufacturing the same and, more particularly, relates to a copper foil for printed wiring having excellent oxidation resistance characterized by a composite layer containing chromium, zinc, phosphorus, and nickel formed on the glossy copper foil surface and also to a method of manufacturing the same.

2. Prior Art

Copper foils that have hitherto been used for printed wiring purposes are those whose glossy surfaces are chromated or otherwise treated, as by chelation with copper using an organic agent such as benzotriazole, for enhanced corrosion resistance.

Those treated copper foils are improved in corrosion resistance as well as oxidation-tarnishing resistance during the course of lamination to insulation substrates. Nevertheless, they are unsatisfactory in other properties such as solder wettability and oxidation resistance at the time of heating.

Under the circumstances Japanese Patent Application Kokai No. 5-299834 discloses an electrolytic copper foil characterized by a composite layer containing chromium, zinc, and phosphorus formed on the glossy surface of the foil. Advantages claimed of the foil are good resistance to heating and oxidation tarnishing during and after lamination to insulation substrates, corrosion resistance, solder wettability, and ease of black oxidation treatment.

However, the copper foil provided with a composite layer containing chromium, zinc, and phosphorus as taught in the Patent Application Kokai No. 5-299834 has an oxidation resistance problem. It has been observed to undergo serious oxidation tarnishing of the entire surface under certain heating conditions (e.g., at 180° C. for 30 minutes).

SUMMARY OF THE INVENTION

It is therefore an object of the present invention to establish a technique of further improving the oxidation resistance of the glossy surface of a copper foil that has a composite layer containing chromium, zinc, and phosphorus on its glossy surface.

It has now been found that the addition of nickel to the composite layer that contains chromium, zinc, and phosphorus further enhances the oxidation resistance of the glossy surface of the copper foil.

Thus the invention provides a copper foil having a glossy surface with excellent oxidation resistance characterized by a composite layer containing chromium, zinc, phosphorus, and nickel formed on the glossy surface.

The copper foil may have the composite layer formed with an intermediate layer of a material selected from the group consisting of zinc, nickel, chromium, tin, and their alloys on the glossy surface.

It is desirable that the amounts of the components deposited in the composite layer be:

deposited amount of Cr: 10–50 $\mu g/dm^2$ deposited amount of Zn: 30–300 $\mu g/dm^2$ deposited amount of Ni: 5–50 $\mu g/dm^2$ deposited amount of P: 1–50 $\mu g/dm^2$.

The invention further provides a method of manufacturing a copper foil having a glossy surface with excellent oxidation resistance characterized by an anti-corrosive treatment of the glossy copper foil surface with a bath of a composition comprising Cr: 0.1–2.0 g/L Zn: 0.1–3.0 g/L P: 0.01–1.0 g/L Nit: 0.1–0.5 g/L, whereby a composite layer containing chromium, zinc, phosphorus, and nickel is formed on the glossy copper foil surface.

Oxidation resistance increases as the Ni concentration in copper foil rises. In an ordinary composite layer containing chromium, zinc, and phosphorus, zinc is present in the form of metallic zinc that readily diffuses with heat. The addition of Ni in accordance with the present invention forms a Zn—Ni alloy that is less diffusible on heating. This presumably combines with an increase in the amount of Zn deposition with a change in deposition potential to achieve a favorable effect upon the oxidation resistance.

PREFERRED EMBODIMENTS OF THE INVENTION

The copper foil to be used for the purposes of the invention may be either electrolytic or rolled one. Electrolytic copper foil is made by an electrolytic equipment which comprises a rotary drum anode partly immersed in an electrolyte bath and an arcuate cathode facing the anode in spaced relation, with an electrolyte solution flown in between. Copper is electrodeposited on the rotary drum and eventually a resulting copper foil of a desired thickness is separated from the drum. Rolled copper foil is made by a rolling process. The side (surface) of the copper foil to be laminated to an insulation substrate is roughened beforehand.

The present invention is concerned with the treatment of the glossy surface, on the side opposite to the roughened side, of a copper foil. The amounts of the components to be deposited in the composite layer according to the invention are such that the outstanding properties of the composite layer containing chromium, zinc, and phosphorus can be fully exhibited while the addition of nickel further improves the oxidation resistance of the glossy copper foil surface.

The amounts of the components to be deposited in the composite layer desirably come within the following ranges:

Deposited amount of Cr: 10–50 $\mu g/dm^2$ deposited amount of Zn: 30–300 $\mu g/dm^2$ deposited amount of Ni: 5–50 $\mu g/dm^2$ deposited amount of P: 1–50 $\mu g/dm^2$.

When the deposited amount of Cr is less than 10 $\mu g/dm^2$ the resulting layer has inferior anti-weathering properties. When the amount is greater than 50 $\mu g/dm^2$ a serious decrease in resist adhesion is observed.

A Zn amount short of 30 $\mu g/dm^2$ lowers the oxidation resistance, whereas a Zn amount in excess of 300 $\mu g/dm^2$ impairs the natural copper color of the resulting foil.

If the amount of Ni deposited is below 5 $\mu g/dm^2$ the component does not have an appreciable effect upon the improvement in oxidation resistance. Conversely if the amount exceeds 50 $\mu g/dm^2$ it tends to sacrifice the superior properties of zinc and zinc oxide-chromium oxide mixture.

A P amount of less than 1 $\mu g/dm^2$ does not have any remarkably beneficial effect upon the oxidation resistance. On the other hand, a P amount of more than 50 $\mu g/dm^2$ lowers the anti-weathering properties.

As for the thickness of the composite layer, a layer from 1 to 100 A thick is desirable. The composite layer according to the invention can be formed by electrolysis using a plating solution that contains compounds of zinc, chromium, phosphorus, and nickel.

The composite layer of the invention can be made by electrolysis under the following conditions:

(1) Bath composition

Cr: 0.1–2.0 g/L

Zn: 0.1–3.0 "

P: 0.01–1.0 "

Ni: 0.1–0.5 "

Na2SO4: 10–20 "

pH: 3.5–6.0.

(2) Electrolytic conditions

Current density: 1–5 A/dm$^2$

Plating time: 0.8–2.0 sec.

Temperature: 30–50° C.

This anti-corrosive treatment produces a composite layer of improved oxidation resistance containing chromium, zinc, phosphorus, and nickel on the glossy surface of a copper foil.

Chromium compounds that may be employed are, for example, chromium trioxide, sodium chromate, and sodium bichromate. Among useful zinc compounds are zinc sulfate, zinc oxide, zinc hydroxide, and zinc carbonate. Useful phosphorus compounds include phosphoric acid, phosphorous acid, disodium phosphate, and trisodium phosphate. Nickel compounds of use are nickel sulfate, nickel oxide, etc.

It is beneficial also to form the composite layer not directly on the glossy surface of a copper foil but on an intermediate layer of a material selected from the group consisting of zinc, nickel, chromium, tin, and their alloys.

Working Examples

Using small rotary electrodes, glossy surfaces of electrolytic copper foils were treated for corrosion resistance with the following bath composition and under the following electrolytic conditions:

(1) Bath composition

Cr: 0.8 g/L

Zn: 0.6 "

P: 0.2 "

Ni: 0.2 "

Na2SO4: 16 "

pH: 4.7.

(2) Electrolytic conditions

Current density: 3.4 A/dm$^2$

Plating time: 1.5 sec.

Temperature: 37° C.

The thus treated copper foils were allowed to stand in an oven at 180° C. for 30 minutes. Thereafter their degrees of oxidation resistance were determined through visual observation of the surfaces. Table 1 shows the results. The criteria for the determination were as follows:

x=the entire surface seriously tarnished by oxidation (brown)

Δ=the entire surface lightly tarnished by oxidation (light brown)

○=no tarnishing

TABLE 1

| | Test results | | | | |
|---|---|---|---|---|---|
| Ni | Deposited amount ($\mu$g/dm$^2$) | | | | Oxidation resistance |
| (mg/L) | Cr | Zn | Ni | P | 180° C. × 30 min |
| 0 | 26 | 65 | 0 | 14 | x |
| 5 | 23 | 64 | <5 | 12 | x |
| 10 | 21 | 60 | <5 | 11 | x |
| 50 | 21 | 79 | <5 | 13 | Δ |
| 100 | 21 | 89 | 10 | 17 | ○ |
| 500 | 26 | 99 | 32 | 7 | ○ |

The test results given in Table 1 indicate that the higher the Ni concentration the greater the oxidation resistance. With the deposited Ni amount beyond 50 A/dm$^2$, however, the tendency is toward still higher oxidation resistance but at the sacrifice of the excellent properties of zinc and zinc oxide-zinc chromium mixture.

TABLE 2

| | Cases in which P is not added: | | | | |
|---|---|---|---|---|---|
| Ni | Deposited amount ($\mu$g/dm$^2$) | | | | Oxidation resistance |
| (mg/L) | Cr | Zn | Ni | P | 180° C. × 30 min |
| 0 | 35 | 30 | 0 | 0 | x |
| 5 | 30 | 30 | <5 | 0 | x |
| 10 | 36 | 40 | <5 | 0 | x |
| 50 | 30 | 49 | <5 | 0 | x |
| 100 | 32 | 56 | <5 | 0 | x |
| 500 | 31 | 83 | 10 | 0 | ○ |

The copper foil that has a composite layer containing chromium, zinc, and phosphorus on its glossy surface is successfully further improved in its oxidation resistance by the addition of nickel.

What is claimed is:

1. A copper foil having a glossy surface with excellent oxidation resistance characterized by a composite layer containing chromium, zinc, phosphorus, and nickel formed on the glossy copper foil surface.

2. A copper foil having a glossy surface with excellent oxidation resistance characterized by a composite layer containing chromium, zinc, phosphorus, and nickel formed, through an intermediate layer of a material selected from the group consisting of zinc, nickel, chromium, tin, and alloys thereof, on the glossy copper foil surface.

3. A copper foil having a glossy surface with excellent oxidation resistance according to claim 1, characterized in that the amounts of components deposited in the composite layer are:

deposited amount of Cr: 10–50 $\mu$g/dm$^2$ deposited amount of Zn: 30–300 $\mu$g/dm$^2$ deposited amount of Ni: 5–50 $\mu$g/dm$^2$ deposited amount of P: 1–50 $\mu$g/dm$^2$.

4. A method of manufacturing a copper foil having a glossy surface with excellent oxidation resistance characterized by an anti-corrosive treatment of the glossy copper foil surface with a bath of a composition comprising Cr: 0.1–2.0 g/L Zn: 0.1–3.0 "

P: 0.01–1.0 "

Ni: 0.1–0.5 ", whereby a composite layer containing chromium, zinc, phosphorus, and nickel is formed on the glossy copper foil surface.

5. A copper foil having a glossy surface with excellent oxidation resistance according to claim 2, characterized in that the amounts of components deposited in the composite layer are:

deposited amount of Cr: 10–50 $\mu g/dm^2$
deposited amount of Zn: 30–300 $\mu g/dm^2$
deposited amount of Ni: 5–50 $\mu g/dm^2$
deposited amount of P: 1–50 $\mu g/dm^2$.

* * * * *